(12) United States Patent
Chakraborty et al.

(10) Patent No.: US 9,653,650 B2
(45) Date of Patent: *May 16, 2017

(54) METHOD AND SYSTEM FOR EPITAXY PROCESSES ON MISCUT BULK SUBSTRATES

(71) Applicant: SORAA, INC., Fremont, CA (US)

(72) Inventors: Arpan Chakraborty, Fremont, CA (US); Michael Grundmann, Fremont, CA (US); Anurag Tyagi, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/992,939

(22) Filed: Jan. 11, 2016

(65) Prior Publication Data

US 2016/0268476 A1    Sep. 15, 2016

Related U.S. Application Data

(63) Continuation of application No. 13/431,834, filed on Mar. 27, 2012, now Pat. No. 9,236,530.

(60) Provisional application No. 61/470,901, filed on Apr. 1, 2011.

(51) Int. Cl.
| | |
|---|---|
| *H01L 33/00* | (2010.01) |
| *H01L 21/00* | (2006.01) |
| *H01L 33/32* | (2010.01) |
| *H01L 21/02* | (2006.01) |
| *H01L 33/16* | (2010.01) |
| *H01L 33/06* | (2010.01) |
| *H01L 33/12* | (2010.01) |

(52) U.S. Cl.
CPC .......... *H01L 33/32* (2013.01); *H01L 21/0243* (2013.01); *H01L 21/0254* (2013.01); *H01L 21/02389* (2013.01); *H01L 21/02433* (2013.01); *H01L 21/02458* (2013.01); *H01L 33/0075* (2013.01); *H01L 33/06* (2013.01); *H01L 33/12* (2013.01); *H01L 33/16* (2013.01)

(58) Field of Classification Search
CPC ................ H01L 33/32; H01L 33/0075; H01L 21/02433; H01L 21/02458; H01L 21/02389; H01L 21/0254
See application file for complete search history.

(56) References Cited

U.S. PATENT DOCUMENTS

| | | | |
|---|---|---|---|
| 9,236,530 B2 * | 1/2016 | Chakraborty | ..... H01L 21/02389 |
| 2011/0216795 A1 * | 9/2011 | Hsu | ..................... B82Y 20/00 |
| | | | 372/44.011 |

* cited by examiner

*Primary Examiner* — Alonzo Chambliss
(74) *Attorney, Agent, or Firm* — Saul Ewing LLP

(57) ABSTRACT

A method for providing (Al,Ga,In)N thin films on Ga-face c-plane (Al,Ga,In)N substrates using c-plane surfaces with a miscut greater than at least 0.35 degrees toward the m-direction. Light emitting devices are formed on the smooth (Al,Ga,In)N thin films. Devices fabricated on the smooth surfaces exhibit improved performance.

20 Claims, 14 Drawing Sheets

METHOD AND SYSTEM FOR EPITAXY PROCESSES ON MISCUT BULK SUBSTRATES

CROSS REFERENCE TO RELATED APPLICATIONS

This application is a continuation application of U.S. application Ser. No. 13/431,834, filed Mar. 27, 2012, now U.S. Pat. No. 9,236,530, which claims the benefit of U.S. Provisional Application No. 61/470,901, filed Apr. 1, 2011, all of which are incorporated by reference herein in their entireties.

BACKGROUND

The present disclosure is directed to fabrication of optical devices. More particularly, the disclosure provides method and devices using a miscut (Al, Ga, In)N bulk crystal. Certain embodiments provided by the disclosure include techniques for fabricating light emitting devices using miscut gallium nitride containing materials. Such devices can be applied to applications such as optoelectronic devices. In certain embodiments, the disclosure provides methods of manufacture using an epitaxial gallium containing crystal with extremely smooth surface morphology and uniform wavelength over a large surface area of the substrate. Such crystals and materials include GaN, AlN, InN, InGaN, AlGaN, and AlInGaN, for manufacture of bulk or patterned substrates.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoors. Unfortunately, the conventional light bulb dissipates more than 90% of the energy used as thermal energy. Additionally, the light bulb eventually fails due to evaporation of the tungsten filament.

Fluorescent lighting uses an optically clear tube filled with a noble gas, and typically also contains mercury. A pair of electrodes is coupled to an alternating power source through a ballast. Once the mercury has been excited, it discharges to emit UV light. Typically, the tube is coated with phosphors, which are excited by the UV light to provide white light. Recently, fluorescent lighting has been fitted onto a base structure to couple into a standard socket.

Solid state lighting relies upon semiconductor materials to produce light emitting diodes, commonly called LEDs. At first, red LEDs were demonstrated and introduced into commerce. Modern red LEDs use Aluminum Indium Gallium Phosphide or AlInGaP semiconductor materials. Most recently, Shuji Nakamura pioneered the use of InGaN materials to produce LEDs emitting light in the blue range for blue LEDs. The blue LEDs led to innovations in lighting, and the blue laser diode enabled DVD players, and other developments. Blue, violet, or ultraviolet-emitting devices based on InGaN are used in conjunction with phosphors to provide white LEDs.

BRIEF SUMMARY

The disclosure generally relates to manufacture of materials and devices. More particularly, the disclosure provides methods and devices using a miscut (Al,Ga,In)N bulk crystal. Certain embodiments provided by the disclosure include techniques for fabricating light emitting devices and/or electronic devices using miscut gallium nitride containing materials. Devices provided by the present disclosure can be applied to applications such as optoelectronic devices. In certain embodiments, the disclosure provides methods of manufacture using a high quality epitaxial gallium containing crystal with extremely smooth surface morphology and uniform wavelength across a large surface area of the substrate. Such crystals and materials include GaN, AlN, InN, InGaN, AlGaN, and AlInGaN, for manufacture of bulk or patterned substrates.

Certain embodiments provided by the present disclosure include methods for processing and utilizing bulk substrates. Certain methods include fabricating at least one (Al,Ga,In)N thin film directly on a (Al,Ga,In)N substrate or template. The substrate or template has a surface characterized by a miscut angle of at least 0.35 degrees along the m-direction, and the projection of the surface normal coincides with the m-axis. The substrate or template can be obtained by slicing a c-plane wafer at a predetermined miscut angle of at least 0.35 degrees relative to c-plane toward or away from m-direction.

In certain embodiments, the present disclosure provides methods for manufacturing optical devices from a bulk substrate material, such as a bulk gallium an nitrogen containing substrate material, for example, GaN. Methods include providing a bulk gallium an nitrogen containing substrate material having a top surface. At least one surface region on the top surface of the bulk gallium an nitrogen containing substrate has a miscut angle of at least 0.35 degrees toward the m-direction. Methods also include subjecting the surface region to a treatment process to remove one or more areas with surface damage or sub-surface damage within the surface region A treatment process can be a thermal process using a hydrogen and nitrogen bearing species In certain embodiments, the method include forming a n-type gallium and nitrogen material (or undoped material) overlying the surface region and forming an active region from a stack of thin film layers. Each of the thin film layers may comprise an indium species, an aluminum species, and a gallium and nitrogen containing species overlying the n-type gallium and nitrogen containing material. In certain embodiments, the method includes forming an aluminum gallium and nitrogen containing electron blocking material overlying the active region and forming a p-type gallium and nitrogen containing material overlying the electron blocking material to cause formation of a processed gallium and nitrogen containing substrate. In certain embodiments, the processed bulk gallium and nitrogen containing substrate is characterized by a photoluminescence (PL) wavelength standard deviation of 0.2% and less; and each of the thin film layers have a surface region characterized by a root mean squared (RMS) surface roughness of 0.3 nm and less over an area of at least 2,500 $\mu m^2$.

In certain embodiments, a hydrogen bearing species and a nitrogen bearing species are derived from hydrogen gas and ammonia gas, respectively. In certain embodiments, a n-type gallium and nitrogen containing material is no-type GaN. In certain embodiments, a p-type gallium and nitrogen containing material is p-type GaN. In certain embodiment, an electron blocking material is AlGaN. In certain embodiment, each of the thin film layers forming the active region is AlInGaN. In certain embodiments, the active layer comprises a plurality of quantum wells, which comprise, for example, from three to twenty quantum wells. In certain embodiments, each of the quantum wells may be separated by a barrier region. In certain embodiments, a barrier region comprises GaN.

In certain embodiments, the present disclosure provides methods for fabricating a device. Method include, for example, providing a gallium and nitrogen containing substrate having a surface region, which has a c-plane surface region characterized by a miscut angle of at least 0.35 degrees from the c-plane toward the m-direction. In certain embodiments, the method includes forming a gallium and nitrogen containing thin film comprising an aluminum bearing species and an indium bearing species on the gallium and nitrogen containing substrate. In certain embodiment the methods include forming an electrical contact region overlying the thin film.

The disclosure provides ways for identifying and selecting portions and/or regions of a substrate that are suitable for manufacturing LED diodes or other devices. Such regions are characterized by a miscut angle of at least 0.35 degrees toward the m-direction on a gallium and nitrogen containing substrate. Surprisingly, using miscut angles of at least 0.35 degrees toward the m-direction improves consistency and yield of processed devices. By having a miscut angle of at least 0.35 degrees toward the m-direction, or in certain embodiments, greater than 0.4 degrees toward the m-direction and/or the a-direction, as opposed to a lower miscut angle, the surface morphology of a substrate is improved in a way that is advantageous for manufacturing LED devices such that the manufacturing yield of the devices is increased and the performance is improved. A miscut angle of at least 0.35 degrees toward the m-direction results in a smooth substrate surface to improved device performance and reliability. One of the reasons for improved performance is that a smooth substrate surface results in high carrier mobility and lower series resistance. In addition, a smooth substrate surface reduces optical scattering of optical devices formed on the substrate. Overall, improved PL performance is achieved using a miscut of at least 0.35 degrees from a c-plane toward the m-direction.

DETAILED DESCRIPTION

Figure 1:
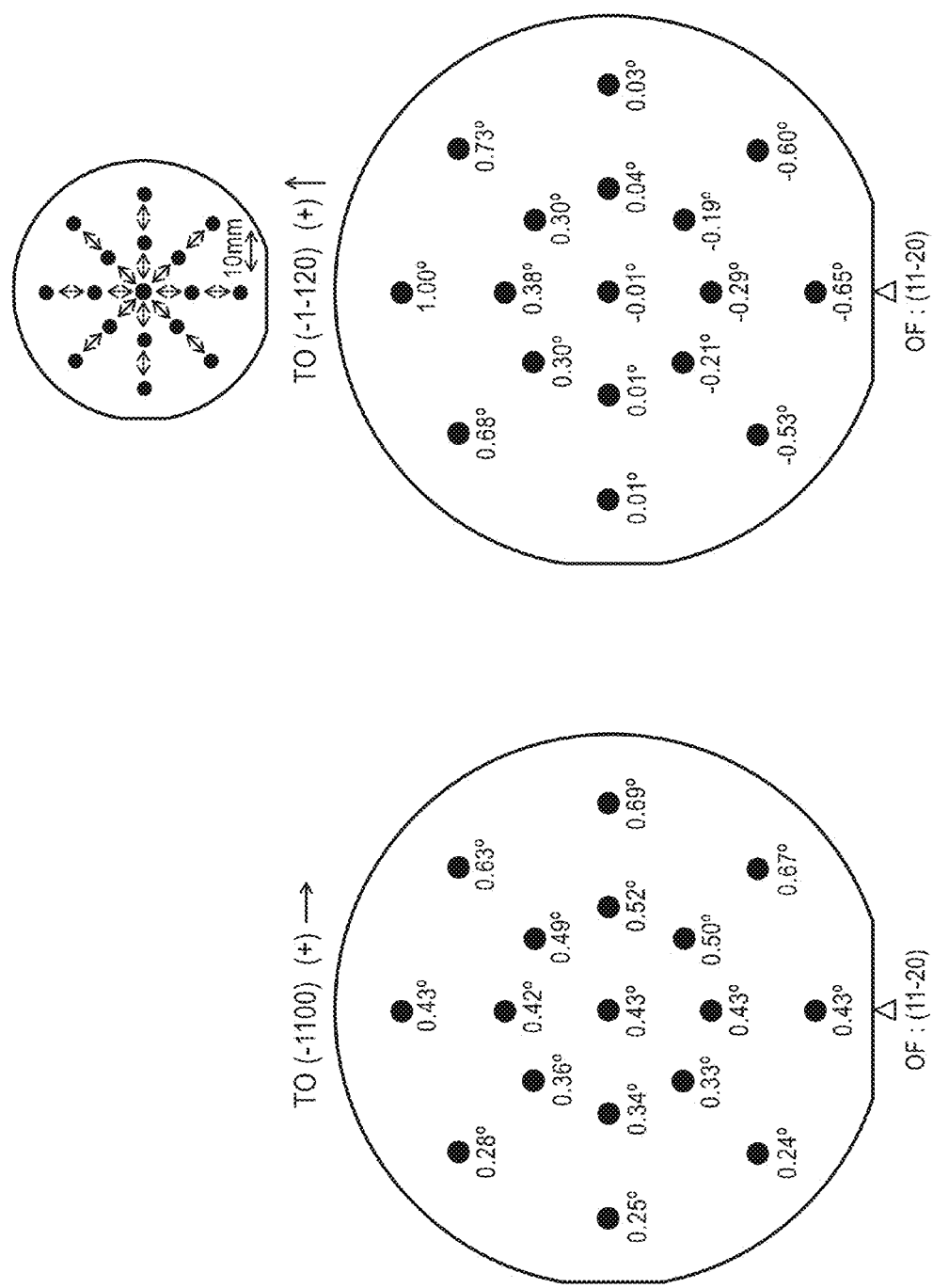
FIG. 1A shows a miscut map of a substrate (Substrate A) cut along the m-direction. The values represent angles with respect to the c-plane.
FIG. 1B shows a miscut map of a substrate cut along the a-direction. The values represent angles with respect to the c-plane.

Reference is now made to certain embodiments of polymers, compositions, and methods. The disclosed embodiments are not intended to be limiting of the claims. To the contrary, the claims are intended to cover all alternatives, modifications, and equivalents.

The present disclosure generally relates to the manufacture of materials and devices. More particularly, the present disclosure provides methods and devices using a miscut (Al,Ga,In)N bulk crystal. Certain embodiments provided by the present disclosure include techniques for fabricating light emitting devices using miscut gallium nitride containing materials. Devices provided by the present disclosure can be applied to applications such as optoelectronic devices. In certain embodiments, the present disclosure provides methods of manufacture using an epitaxial gallium containing crystal having a smooth surface morphology and uniform wavelength across a large area of the substrate. Such crystals and materials include GaN, AlN, InN, InGaN, AlGaN, and AlInGaN, and can be used for the manufacture of bulk or patterned substrates. As used herein, the term substrate also includes templates.

As background information, conventional GaN-based light emitting diodes (LED) emitting in the ultraviolet and visible regions are typically based on hetereoepitaxial growth where growth is initiated on a substrate other than GaN such as sapphire, silicon carbide, or silicon. This is due to the limited supply and high cost of free-standing GaN substrates, which has prevented their viability for use in LED manufacture. However, the field of bulk-GaN technology has seen rapid gains over the past couple of years providing promise for large-scale deployment into LED manufacture. Such a technology shift will provide benefits to LED performance and manufacturing.

Progress has been made during the past decade and a half in the performance of gallium nitride-(GaN) based light emitting diodes. Devices with a luminous efficiency greater than 100 lumens per watt have been demonstrated in the laboratory, and commercial devices have an efficiency that is already considerably superior to that of incandescent lamps, and that is competitive with fluorescent lamps. Further improvements in efficiency can reduce operating costs, reduce electricity consumption, and decrease emissions of carbon dioxide and other greenhouse gases produced in generating the energy used for lighting applications.

Smooth morphology is important for high-quality crystal growth. Heavily dislocated films of GaN grown on sapphire, SiC, or other non-native substrates have morphologies and growth conditions dictated by the microstructure of the film. On the other hand, growth of GaN on native bulk substrates is no longer heavily mediated by the defect structure of the film; thus it can be expected that optimum growth conditions and surfaces may be different from growth on dislocated material. Unfortunately, obtaining smooth morphology for crystals used for making LEDs is difficult, especially when GaN material is grown on native bulk substrates. The surface of GaN material used for manufacturing LED devices is often uneven, and usually has miscuts, which are generally thought undesirable for LED devices. The present disclosure takes advantage of the miscuts and uneven surface of the GaN substrate, as described below. As used herein, "miscut" refers to a surface angle that is off from the "a-plane," the "m-plane," or other crystallographic plane. "Miscut" also refers to the angle between a wafer surface and the closest high-symmetry/low-index major crystallographic plane, e.g., c-plane, m-plane, or a-plane.

Certain embodiments provided by the disclosure provide methods for improving the surface morphology of (Al,Ga,In)N thin films grown on bulk (Al,Ga,In)N substrates. Methods provided by the present disclosure also result in a uniform emission wavelength in layer structures containing (Al,Ga,In)N bulk layers or heterostructures. The obtained smooth (Al,Ga,In)N thin films can serve as a template for the growth of high performance light emitting and electronic devices. Common vapor phase epitaxy techniques, such as metalorganic chemical vapor deposition (MOCVD), molecular beam epitaxy (MBE) and hydride vapor phase epitaxy (HYPE), can be used to grow the (Al,Ga,In)N thin films. Certain embodiments provided by the present disclosure, however, are equally applicable to (Ga,Al,In,B)N thin films grown by other suitable vapor phase growth techniques.

Disclosed herein are methods for improving the surface morphology of (Al,Ga,In)N thin films grown on bulk substrates by intentionally employing miscuts. Improved surface morphology can lead to a number of advantages for nitride devices, including improved uniformity in the thickness, composition, doping, electrical properties, and/or luminescence characteristics of the individual layers in a given device. Furthermore, the resulting smooth surfaces lead to significant reductions in optical scattering losses, which is beneficial to the performance of, for example, laser diodes.

Typically when epitaxy occurs on a miscut surface, a particular plane is exposed at the end of a terrace in a set of terraces. The miscut direction specifies the plane that is exposed, and for growth on [0001] or [000-1] GaN surfaces, can comprise a superposition of the [1-100] and [11-20] directions. The angle away from normal defines the step density. A miscut toward [1-100], for example, exposes a set of m planes. Smooth surface morphology can be achieved by growing GaN on a native GaN bulk substrates having a miscut toward the [1-100] plane (m-direction) of at least 0.35 degrees. In embodiments wherein a miscut varies across a substrate or wafer, the minimum off-cut toward the [1-100] direction should be at least 0.35° degrees. The substrate miscut in the [11-20] direction may vary by a wider margin, for example, from −1 degrees to 1 degree, in certain embodiments from −1 degrees to 1.5 degrees, or in certain embodiments greater than from −1.5 degrees to 1.5 degrees.

Figure 3:
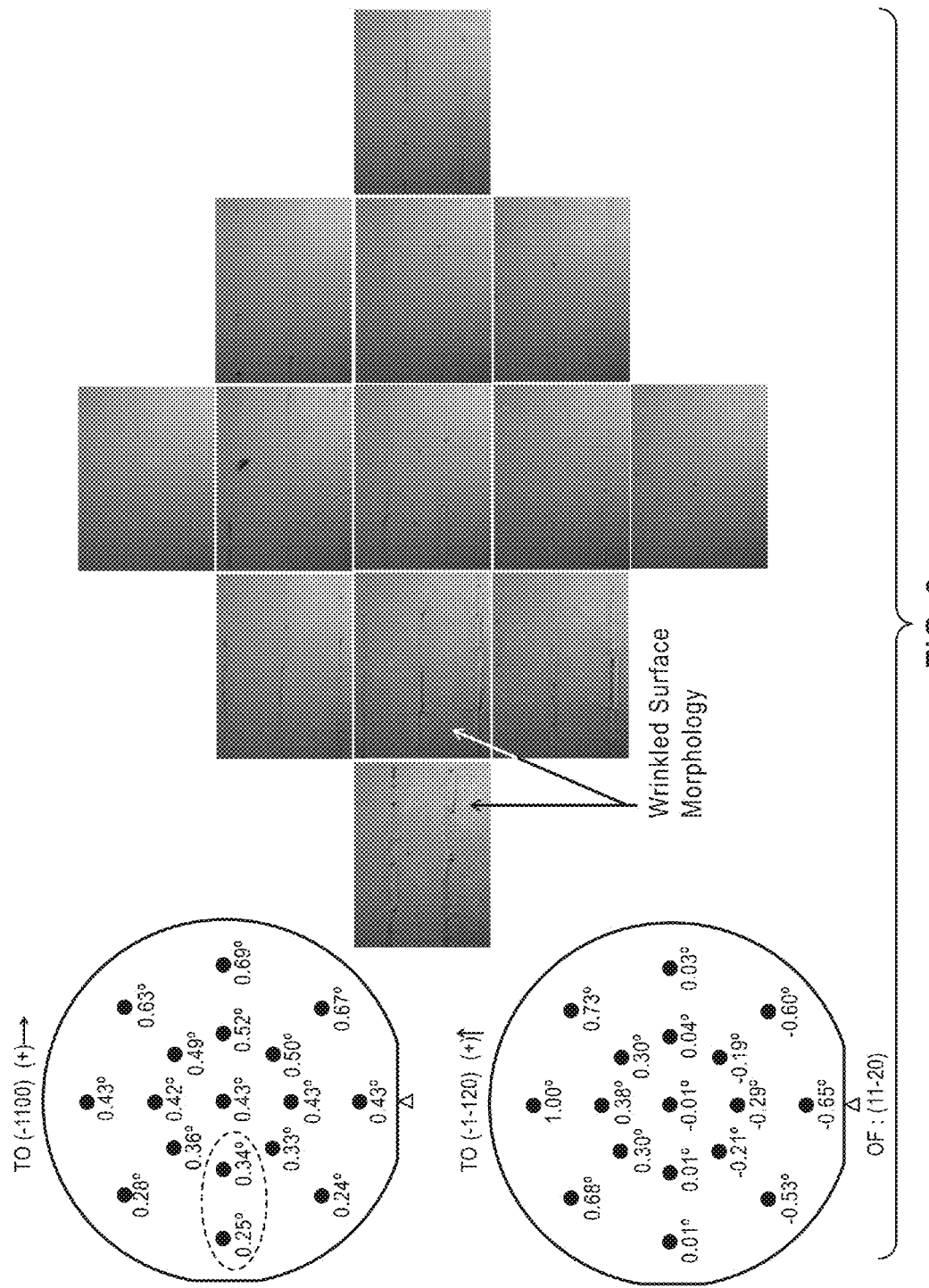
FIG. 3 Nomarski images of the surface morphology of a grown on Substrate A. The Nomarski images correspond to the relative position on Substrate A illustrated on the left side of FIG. 3.
Figure 7:
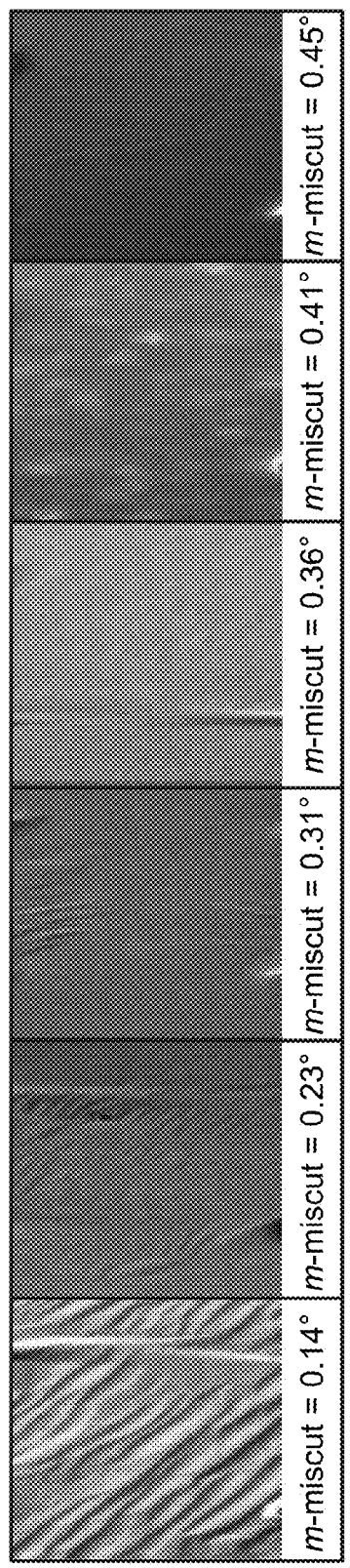
FIG. 7 shows Nomarski images of the surface morphology of a c-plane wafer miscut at angles of 0.14°, 0.23°, 0.31°, 0.36°, 0.41°, and 0.45° toward the m-direction.

Growth on greater miscut angles may yield rough surfaces characterized by severe step-bunching that manifests as a 'rippled' or 'wrinkled' surface as shown in FIG. 3 and in FIG. 7. As shown in FIG. 3 and FIG. 7, the fraction of the surface that is composed of ripples is reduced with increasing miscut angle up to about 0.35 degrees, at which miscut angle significant defects are no longer evident.

Certain embodiments provided by the present disclosure include a nonpolar or semipolar (Ga,Al,In,B)N film comprising a top surface that is a nonpolar or semipolar plane, having a planar and optically smooth area, such that the area has an absence of identifiable non-planar surface undulations or features as measured using an optical microscope and with light wavelengths between 400 nm and 600 nm, wherein the area is sufficiently large for use as a substrate for epitaxial deposition of one or more device layers on a top surface of the area, and the device layers emit light having an output power of at least 2 milliwatts at 20 milliamps (mA) drive current.

FIGS. 1A and 1B are simplified representations of the substrate miscut across a substrate. The substrate shown in FIG. is a bulk GaN substrate. FIG. 1A depicts the variation of m-miscut or miscut toward the [1-100] direction. FIG. 1B depicts the variation of a-miscut or miscut toward the [11-20] direction. The miscut angles with respect to the c-plane are shown in the surfaces of the substrates depicted in FIG. 1A and FIG. 1B. As shown in FIG. 1A, miscut angles toward the m-direction range from about 0.2 degrees to about 0.7 degrees. In comparison, as shown in FIG. 1B, miscuts toward the a-direction range from about −0.65 degrees to about 1 degree.

Figure 2:
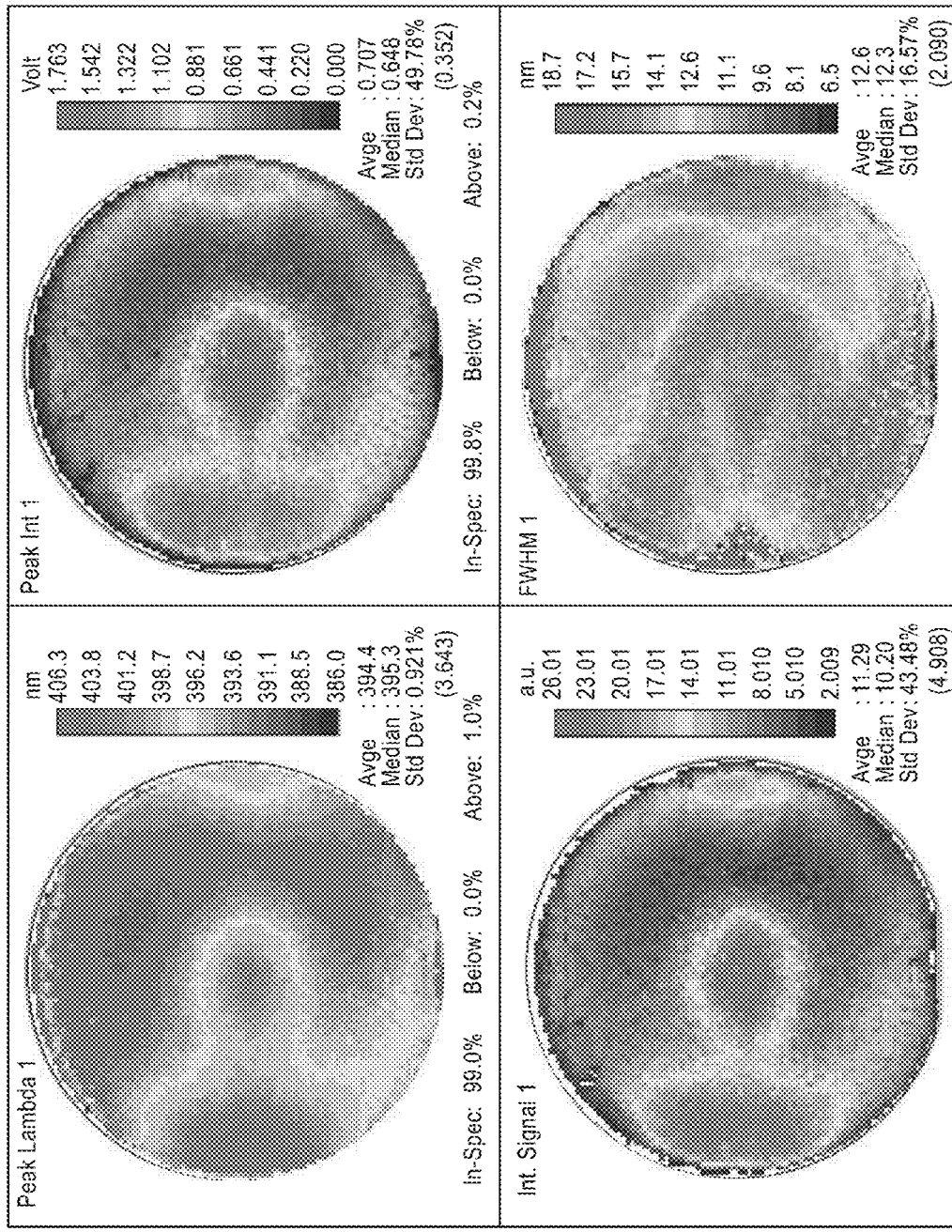
FIG. 2 shows photo luminescence (PL) maps for an InGaN/GaN heterostructure grown on the substrate of FIG. 1A and FIG. 1B.

FIG. 2 shows photoluminescence (PL) maps for an InGaN/GaN heterostructure grown on a substrate. The wavelength distribution, PL intensity, and full-width-half-maximum (FWHM) across the wafer are represented. One aspect of the substrate performance is wavelength consistency, as shown on the top left of FIG. 2 (Peak Lambda 1). Referring to the miscut angles along m-direction shown in FIG. 1A, it can be seen that there is a greater amount of uniformity in wavelength where the miscut angle is at least 0.35 degrees. For example, for a miscut angle of 0.35 degrees or greater toward the m-direction, the wavelength is close to 388.5 nm to 393.6 nm, whereas when the miscut angle is at least 0.35 degrees, the wavelength can be over 400 nm. As an example, the PL emission wavelength across the substrate, for a fixed a-plane miscut, varies with the m-plane miscut, when the m-plane miscut is less than 0.35 degrees. Alternatively, the PL emission wavelength across the substrate, for a fixed m-plane miscut is substantially insensitive to the a-plane miscut. Other PL characteristics such as peak intensity (Peak Int 1), signal intensity (Int. Signal 1) and FWHM across the device surface are also provided.

FIG. 3 shows the surface morphology of a device grown on a substrate. The images were obtained by Nomarski microscopy and correspond to various locations on the substrate. As can be seen, a wrinkled surface becomes visible at the left hand side where the miscut angle along the m-direction is less than 0.35 degrees. In contrast, when the miscut angle is at least 0.35 degrees, the winkled surface is less apparent. Therefore, substrate areas having a miscut angle of at least 0.35 degrees toward the m-direction can be used to eliminate, reduce, or minimize wrinkled surfaces on bulk gallium and nitrogen containing substrates and layers grown on such substrates.

Figure 4:
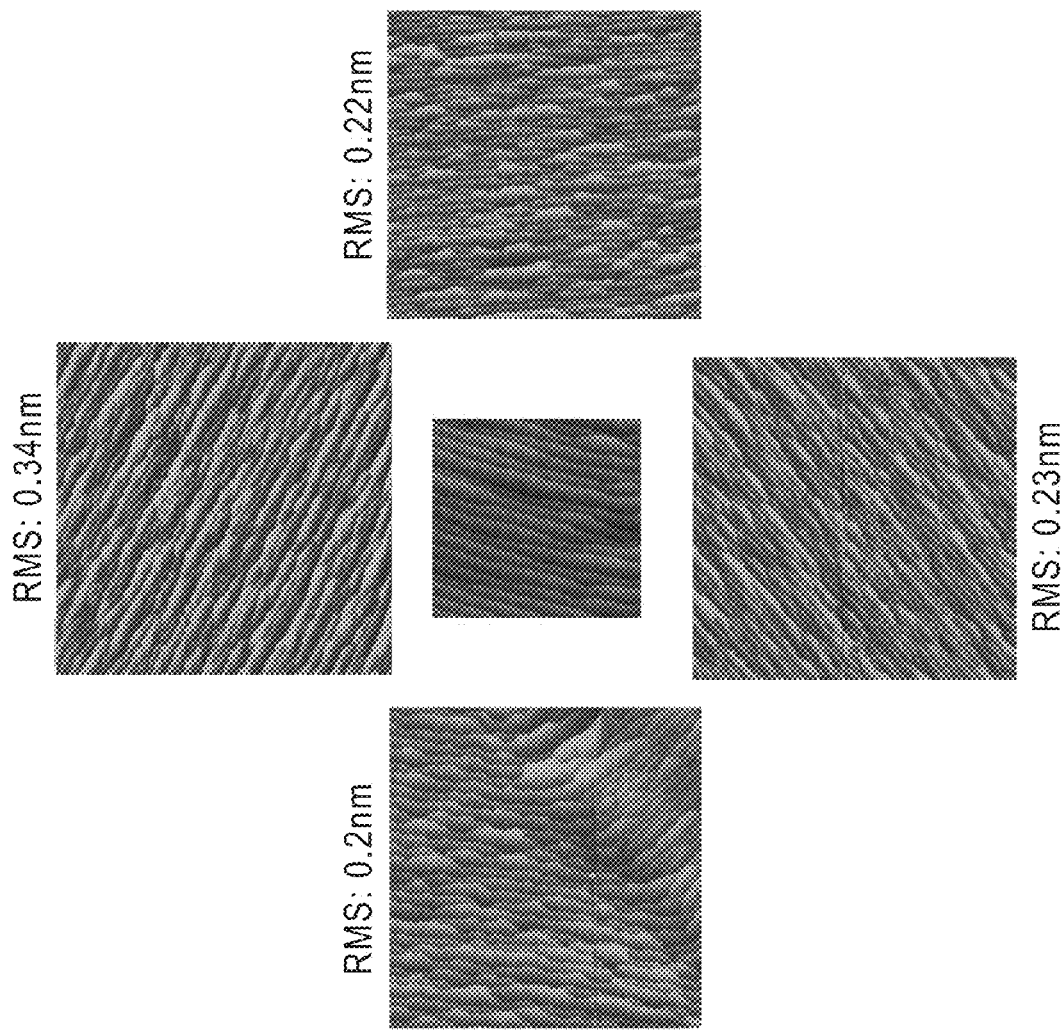
FIG. 4 shows atomic force microscopy (AFM) amplitude images of five 2×2 µm² areas of Substrate A. The root-mean-square (RMS) average amplitudes (nm) are indicated for certain areas.

FIG. 4 shows atomic force microscopy (AFM) amplitude or height images across 2 μm×2 μm areas on different parts of a substrate surface. The corresponding RMS roughness values (nm) are indicated for certain of the individual images.

Figure 5:
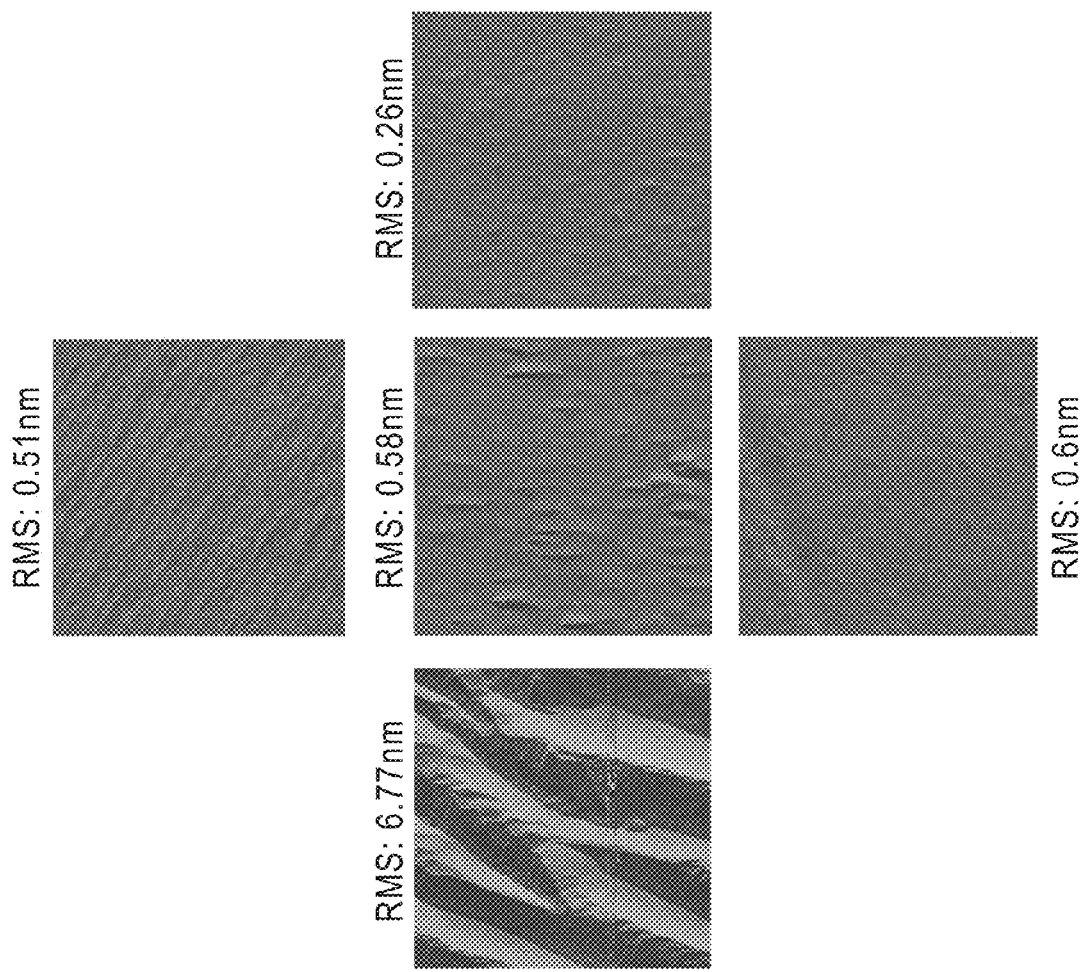
FIG. 5 shows atomic force microscopy (AFM) amplitude images of five 50×50 µm² areas of Substrate A. The root-mean-square (RMS) average amplitudes (nm) are indicated for certain areas.

FIG. 5 shows AFM height or amplitude images across 50 μm×50 μm areas on different parts of a substrate surface. The corresponding RMS roughness (nm) is indicated for each of the individual images. At a 50 μm×50 μm level, the unevenness is more pronounced (e.g., RMS 6.77 nm) for areas with a miscut angle less than 0.35 degrees. In contrast, in areas where the miscut angle is at least 0.35 degrees, the unevenness is less, ranging from RMS of 0.25 nm to 0.6 nm.

In certain embodiments, methods for fabricating (Al,Ga,In)N thin film on substrate areas are provided that have a miscut angle of at least 0.35 degrees. Methods also provide a substrate or template with a miscut away from a low index crystal orientation. A (Al,Ga,In)N thin film can be grown directly on a Ga-face (Al,Ga,In)N substrate or template which is a miscut c-plane substrate or template. The substrate or template can be a Ga-face c-plane substrate or template, and the miscut angle toward [1-100] direction is at least 0.35 degrees. The resulting surface morphology of the (Al,Ga,In)N film is atomically smooth with a RMS roughness of less than 1 nm over at least a 2,500 μm² area of the surface. In certain embodiments, a RMS roughness of less than 0.2 nm over at least a 2,500 μm² area of the surface has also been observed. It is to be appreciated that the miscut angle of at least 0.35 degrees toward the m-direction provides wavelength uniformity for a device fabricated on the surface. In certain embodiments, the standard deviation of wavelength uniformity across the smooth surface is less than 1%, and in certain embodiments, less than 0.2%.

In certain embodiments, the RMS roughness is less than 1 nm over a surface area of at least 500 μm², at least 1,000 μm², at least 1,500 μm², at least 2,000 μm², at least 2,500 μm², at least 3,000 μm², at least 4,000 μm², and in certain embodiments, at least 5,000 μm². In certain embodiments, the RMS roughness is less than 0.2 nm over a surface area of at least 500 μm², at least 1,000 μm², at least 1,500 μm², at least 2,000 μm², at least 2,500 μm², at least 3,000 μm², at least 4,000 μm², and in certain embodiments, at least 5,000 μm².

In certain embodiments, the substrate or template is an Ga-face c-plane substrate or template, and the miscut angle toward the [1-100] direction is at least 0.35 degrees, and less than 0.6 degrees, and in certain embodiments, less than 1 degree. When a (Al,Ga,In)N film is grown on a surface of the miscut, the surface morphology of the (Al,Ga,In)N film is atomically smooth with a RMS roughness of less than 1 nm, and in certain embodiments less than 0.2 nm over at least a 2,500 μm² area of the surface. The wavelength of the emission from a (Al,Ga,In)N containing device grown on the surface is substantially uniform across the surface, with a standard deviation of wavelength uniformity less than 1%, and in certain embodiments, as low as less than 0.2%.

In certain embodiments, the substrate or template is an Ga-face c-plane substrate or template, and the miscut angle toward the [1-100] direction is greater than at least 0.35 degrees and less than 0.75 degrees or, in certain embodiments, less than 0.8 degrees. A (Al,Ga,In)N film grown on a surface of the miscut is atomically smooth with a RMS roughness of less than 1 nm over at least a 2,500 μm² area and in certain embodiments, less than 0.2 nm over at least a 2,500 μm² area of the surface.

A substrate can also be oriented along the c-plane. In certain embodiments, the substrate or template is a Ga-face c-plane substrate or template, and the miscut angle toward the [11-20] direction is greater than −1 degree and less than 1 degree. In certain embodiments, the substrate or template is a Ga-face c-plane substrate or template, the miscut angle toward the [1-100] direction of at least 0.35 degrees and less than 0.6 degrees or in certain embodiments, less than 1 degree; and the miscut angle toward the [11-20] direction is greater than −1 degree and less than 1 degree. A (Al,Ga,In)N film grown on the surface of the miscut has a surface morphology of the (Al,Ga,In)N with a RMS roughness of less than 1 nm, and in certain embodiments less than 0.2 nm over at least a 2,500 μm² of the surface with a standard deviation of wavelength uniformity less than 1% and in certain embodiments, less than 0.2%. Similar results are achieved when the substrate or template is a Ga-face c-plane substrate or template, with a miscut angle toward the [1-100] direction of at least 0.35 degrees and less than 0.75 degrees or in certain embodiments, less than 0.8 degrees; a miscut angle toward the [11-20] direction greater than −1 degree, and less than 1 degree.

The layers of material can be formed in various ways. The multiple (Al,Ga,In)N layers can be grown successively and can be used to form a light emitting device and/or an electronic device. The layers include n- and p-type doped layers in which at least one active region is formed.

In certain embodiments, the present disclosure provides methods for manufacturing LED diodes from bulk substrate material. The methods include providing a bulk substrate material having a top surface with a region characterized by a c-plane orientation with a miscut angle of at least 0.3 degrees or at least 0.35 degrees toward an m-direction. The region is diced to form separate members in which LED diodes are formed.

Figure 6A:
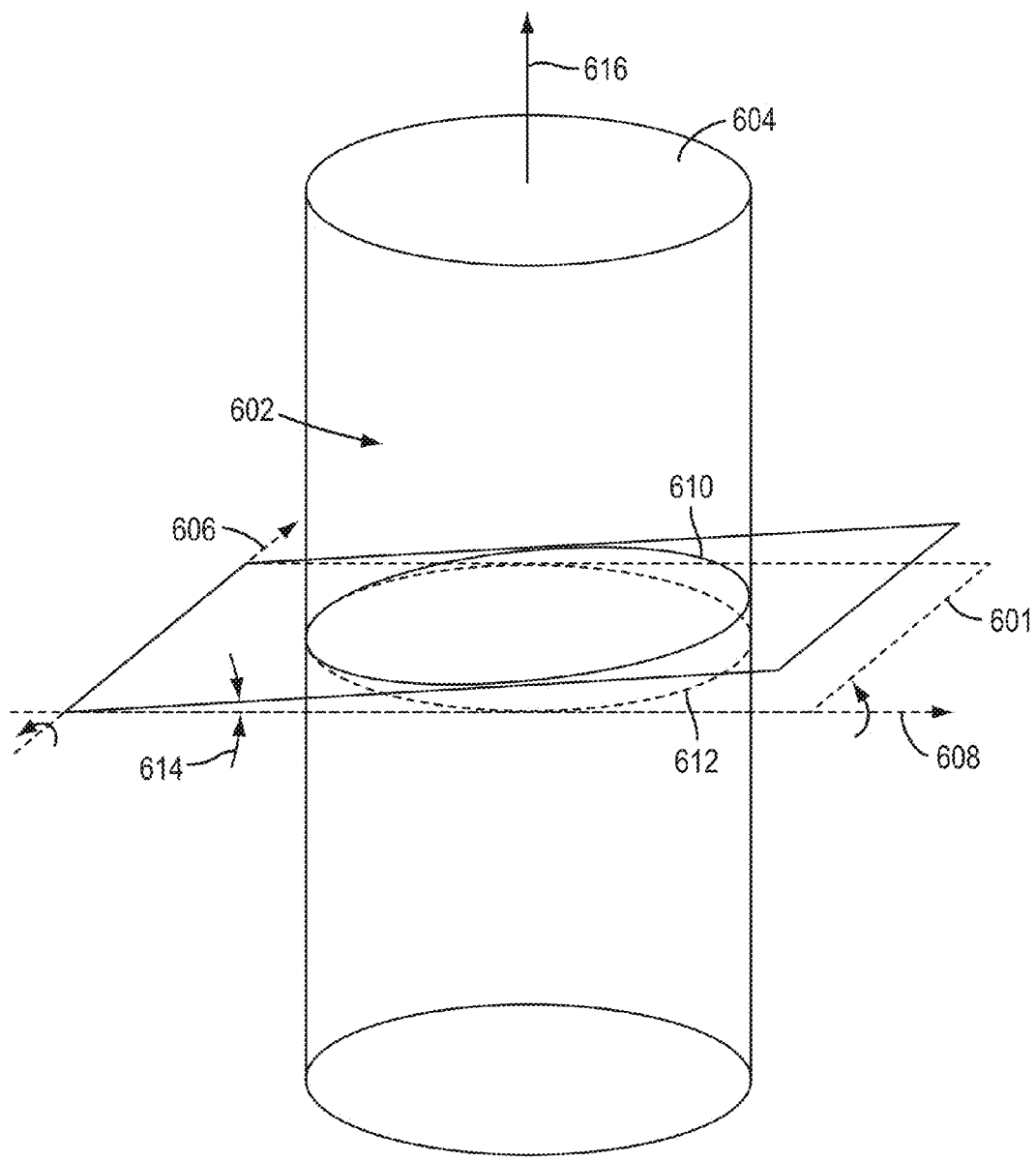
FIG. 6A shows the crystallographic planes for a c-plane wafer miscut toward the m-direction (m-axis).

FIGS. 6A-D illustrate substrate materials according to certain embodiments provided by the present disclosure. In FIG. 6A, a bulk substrate 602 has a cylindrical shape (similar to a single crystal boule) in the direction 616. To obtain substrates that can be used for manufacturing LED devices, the top surface 604 of the bulk substrate 602, which is aligned according to the c-plane 601 (i.e., the crystallographic plane), can be used as a reference plane to generate c-plane wafers 612. Conventional processing techniques include, for example, slicing a bulk substrate 602 along a surface substantially parallel to the c-plane 601 to provide an on-axis c-plane wafer 612. In contrast, certain embodiments provided by the present disclosure use a "miscut angle" surface for the wafer material 610. As shown in FIG. 6A, the c-plane wafer surface is defined by the a-axis 606 and the m-axis 608. In FIG. 6A, a miscut angle 614 of at least 0.35 degrees relative to the m-axis 608 can be selected to obtain an even and smooth surface for the wafer material 610 used to manufacture LED devices.

Figure 6B:
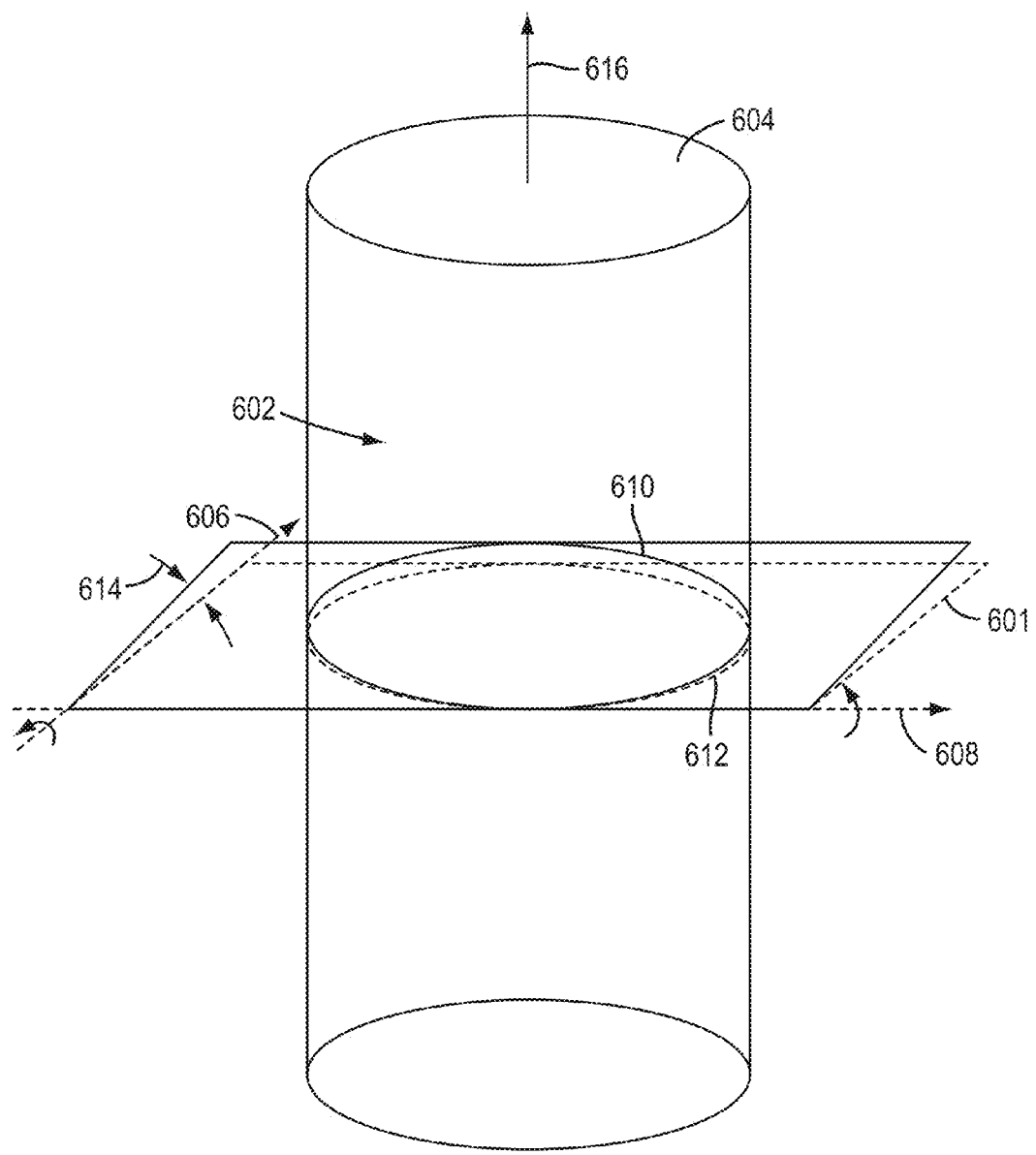
FIG. 6B shows the crystallographic planes for a c-plane wafer miscut toward the a-direction (a-axis).

In FIG. 6B, a bulk substrate 602 has a cylindrical shape (similar to a-s single crystal boule) in the direction 616. To obtain substrates that can be used for manufacturing LED devices, the top surface 604 of the bulk substrate 602, which is aligned according to the c-plane 601 (i.e., the crystallographic plane), can be used as a reference plane to generate c-plane wafers 612. Conventional processing techniques include, for example, slicing a bulk substrate 602 along a surface substantially parallel to the c-plane 601 to provide an on-axis c-plane wafer 612. In contrast, certain embodiments provided by the present disclosure use a "miscut angle" surface for the wafer material 610. As shown in FIG. 6B, the c-plane wafer surface is defined by the a-axis 606 and the m-axis 608. As shown in FIG. 6B, a miscut angle 614 of at least 0.35 degrees relative to the a-axis 606 can be selected to obtain an even and smooth surface for a wafer material 610.

Figure 6C:
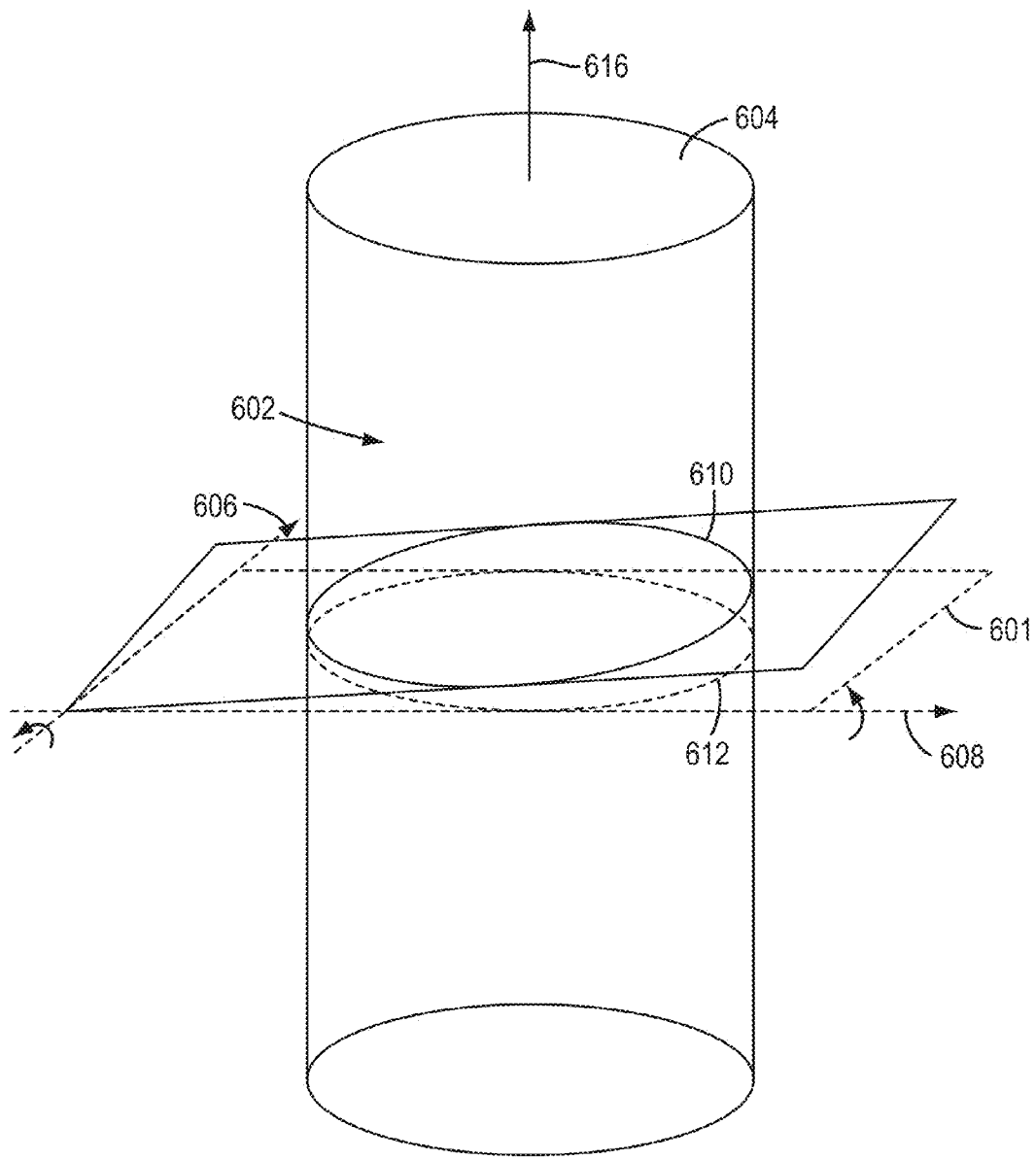
FIG. 6C shows the crystallographic planes for a c-plane wafer miscut toward the m-direction (m-axis) and toward the a-direction (a-axis).

In FIG. 6C, a bulk substrate 602 has a cylindrical shape (similar to a single crystal boule) in the direction 616. To obtain substrates that can be used for manufacturing LED devices, the top surface 604 of the bulk substrate 602, which is aligned according to the c-plane 601 (i.e., the crystallographic plane), can be used as a reference plane to generate c-plane wafers 612. Conventional processing techniques include, for example, slicing a bulk substrate along a surface substantially parallel to the c-plane 601 to provide an on-axis c-plane wafer 612. In contrast, certain embodiments provided by the present disclosure use a "miscut angle" surface for the wafer material 610. As shown in FIG. 6C, the c-plane wafer surface is defined by the a-axis 606 and the m-axis 608. In FIG. 6C, a miscut angle of at least 0.35 degrees relative to both the a-axis 606 and the m-axis 608 can be selected to obtain an even and smooth surface for the wafer material 610.

Figure 6D:
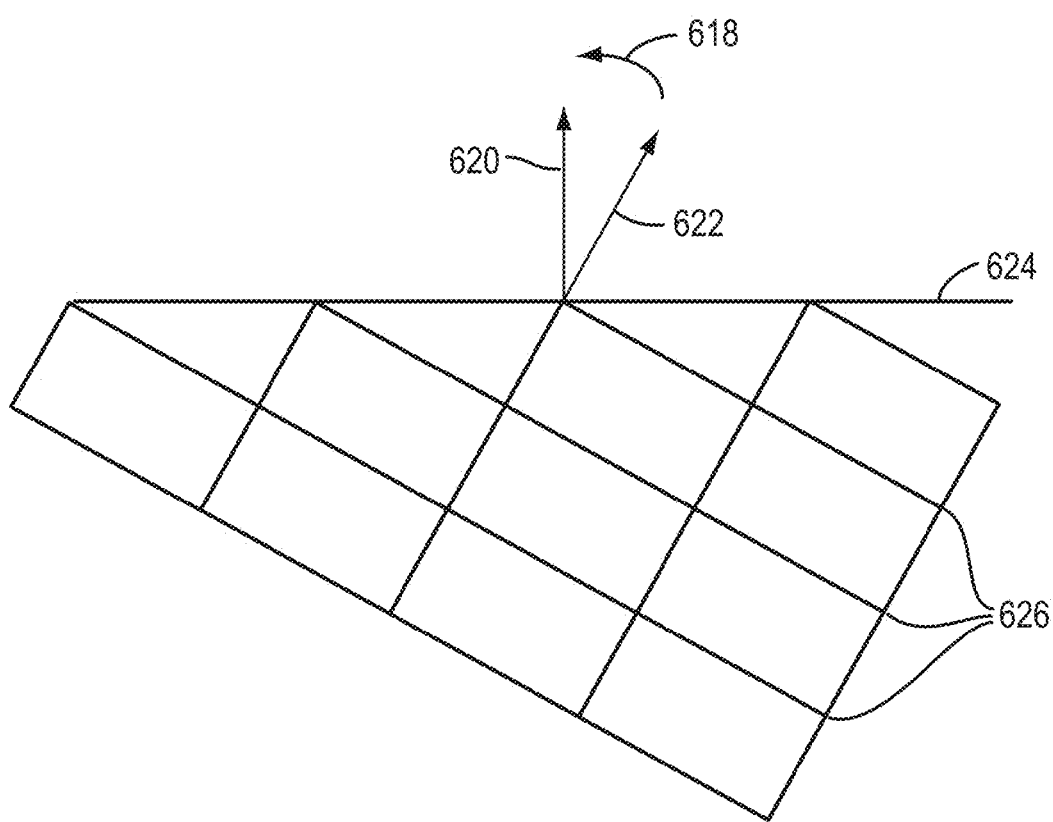
FIG. 6D shows a cross-sectional view of a wafer depicting the relative orientation of lattice planes with respect to the wafer surface for a miscut wafer.

FIG. 6D provides a schematic cross-sectional view depicting relative orientation of lattice planes 626 with respect to a wafer surface 624 in a miscut wafer. As can be seen from FIG. 6D, the miscut direction 618 normal to the surface 620 is "off" from the crystal plane normal 622.

In certain embodiments, the miscut angle on the c-plane is at least 0.30 degrees toward the m-direction, at least 0.32 degrees, at least 0.35 degrees, at least 0.37 degrees, at least 0.40 degrees, and in certain embodiments, at least 0.42 degrees.

FIG. 7 shows images for various miscut substrates according to certain embodiments provided by the present disclosure. As shown, there is a decrease in surface roughness at miscut angles of at least 0.35 degrees toward the m-axis.

Figure 8:
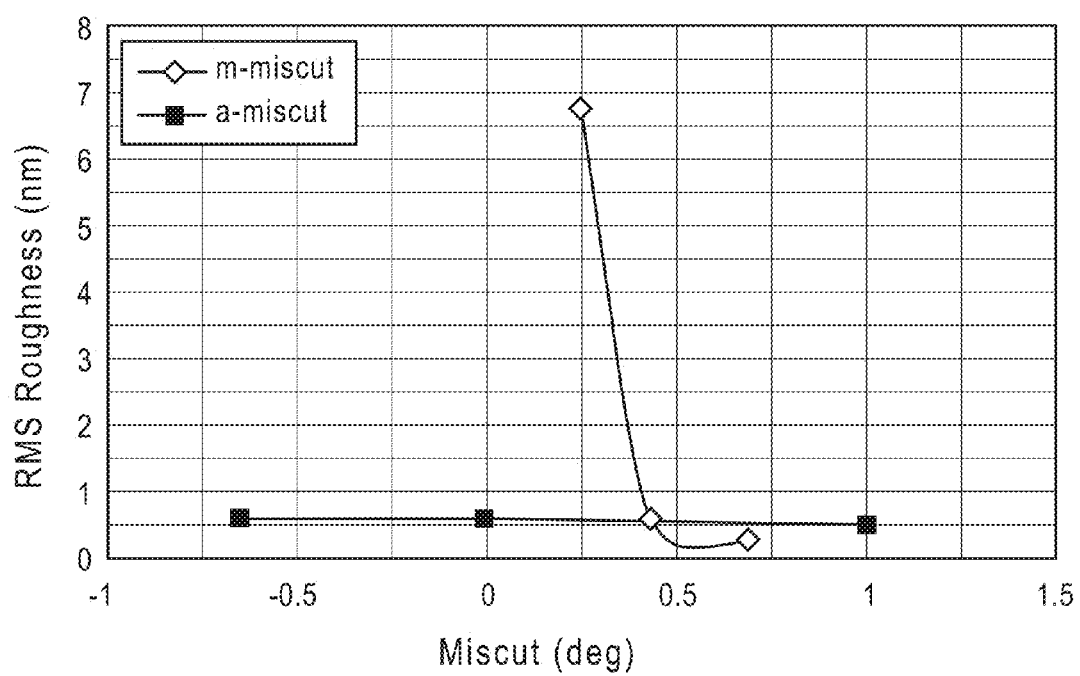
FIG. 8 is a graph showing the relationship between miscut angle in the m-direction and in the a-direction and RMS surface roughness.

FIG. 8 shows the relationship of surface roughness to miscut angle for c-plane substrates miscut toward the m-direction and toward the a-direction according to certain embodiments provided by the present disclosure. As shown, the surface roughness is dramatically reduced at miscut angles of at least about 3.5 degrees toward the m-direction.

Figure 9:
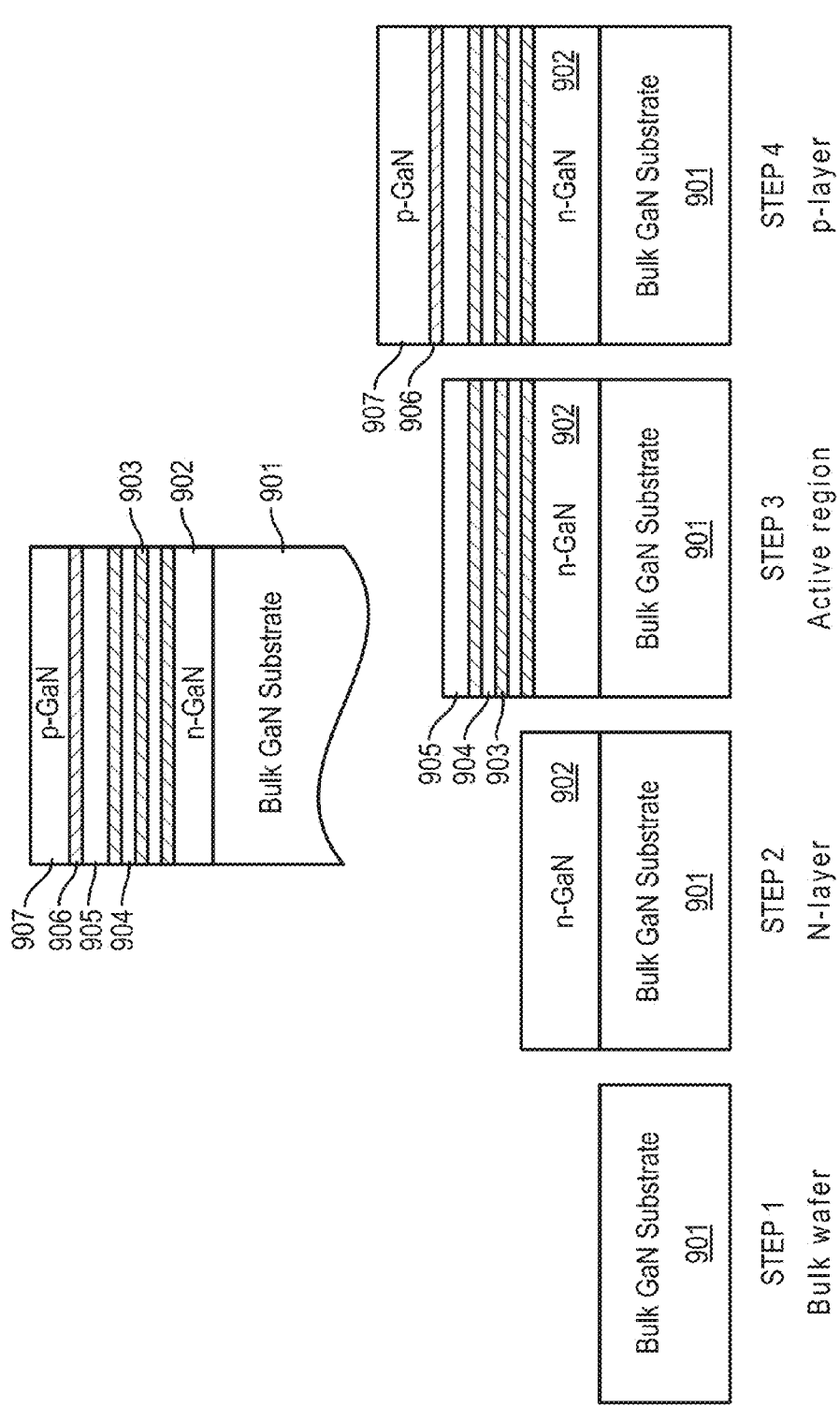
FIG. 9 shows steps for growing an optical device according to certain embodiments provided by the present disclosure.

FIG. 9 shows an example of growth steps for fabricating an optical device according to certain embodiments provided by the present disclosure. The optical device shown in FIG. 9 includes a bulk GaN substrate 901, which can be miscut as provided herein, a n-type layer 902 such as silicon-doped GaN layer, an active region comprising, for example, multiple quantum wells including active layers 903 and barrier layers 904, an electron blocking layer 905, and a p-type layer 907 such as a Mg-doped GaN layer. In certain embodiments, the p-layer comprises a second p-type layer 906, where one p-type layer acts as an electron blocking layer and the second p-type layer serves as a contact area. As shown in FIG. 9, the growth sequence includes depositing at least (1) an n-type epitaxial material; (2) an active region; (3) an electron blocking region; and (4) a p-type epitaxial material. Of course, there can be other variations, modifications, and alternatives. Further details of the present method can be found throughout the present specification and more particularly below. Examples of certain attributes and deposition parameters for the various materials forming the layers shown in FIG. 9 are provided as follows:

1. Bulk wafer:
Any orientation, e.g., polar, non-polar, semi-polar, c-plane.
(Al,Ga,In)N-based material
Threading dislocation (TD) density: <1E8 $cm^{-2}$
Stacking fault (SF) density: <1E4 $cm^{-1}$
Doping: >1E17 $cm^{-3}$ 2. N-type epitaxial material:
Thickness: <5 µm, <1 µm, <0.5 µm, <0.2 µm
(Al,Ga,In)N based material
Growth Temperature: <1,200° C., <1,000° C.
UID or doped
3. Active regions:
At least one AlInGaN layer
Multiple Quantum Well (MQW) structure
QWs are >20 Å, >50 Å, >80 Å thick
QW and n- and p-layer growth temperature identical, or similar
Emission wavelength <575 nm, <500 nm, <450 nm, <410 nm
4. P-type epitaxial material
At least one Mg-doped layer
<0.3 µm, <0.1 µm (Al,Ga,In)N based
Growth T<1100° C., <1000° C., <900° C.
At least one layer acts as an electron blocking layer.
At least one layer acts as a contact layer.

Figure 10:
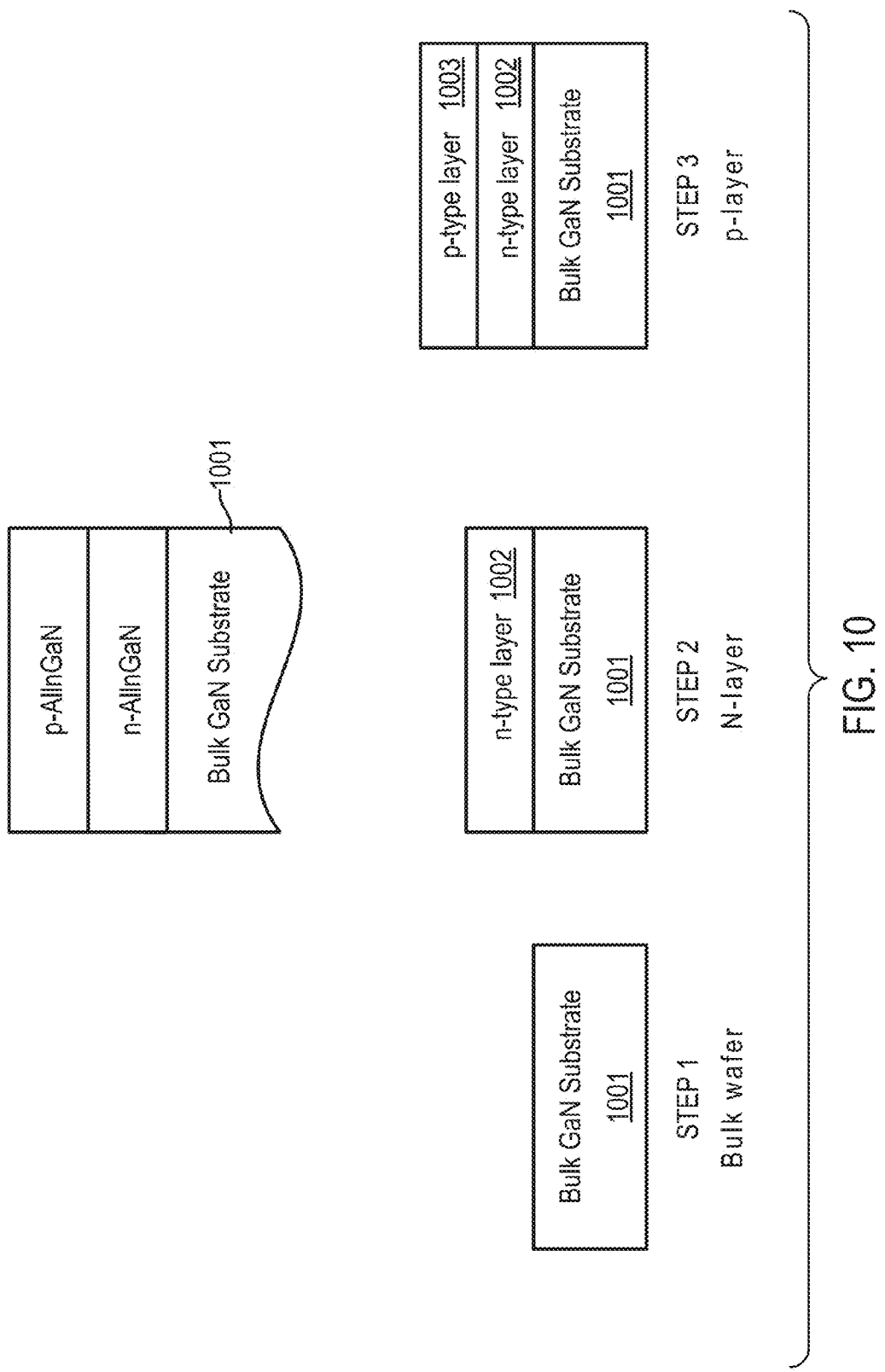
FIG. 10 shows steps for growing a rectifying p-n junction diode according to certain embodiments provided by the present disclosure.

FIG. 10 shows an example of steps for growing a rectifying p-n junction diode according to certain embodiments provided by the present disclosure as shown in FIG. 10, the growth sequence includes depositing at least (1) an n-type epitaxial material 1002; and (4) a p-type epitaxial material 1003. In certain embodiments, bulk GaN substrate 1001 includes a (Al,Ga,In)N-based substrate with any orientation such as a miscut orientation disclosed herein, a threading dislocation density less than 1E8 $cm^{-2}$, a stacking fault density less than 5E3 $cm^{-1}$ and a doping greater than 1E17 $cm^{-3}$. In certain embodiments, n-layer 1002 is (AlGaIn)N-based such as n-GaN. In certain embodiments, n-layer 1002 has a thickness less than 2 µm, less than 1 µm, less than 0.5 µm, and in certain embodiments, less than 0.2 µm. In certain embodiments, n-layer 1002 is grown at a temperature less than 1200° C. and in certain embodiments, less than 1000° C. In certain embodiments, n-layer 1002 may be unintentionally doped or doped. The device shown in the upper portion of FIG. 10 shows an example of a device comprising a bulk GaN substrate 1001, an n-type layer 1002 such as a Si-doped AlInGaN layer, and a p-type layer 1003, such as a Mg-doped AlInGaN layer.

Figure 11:
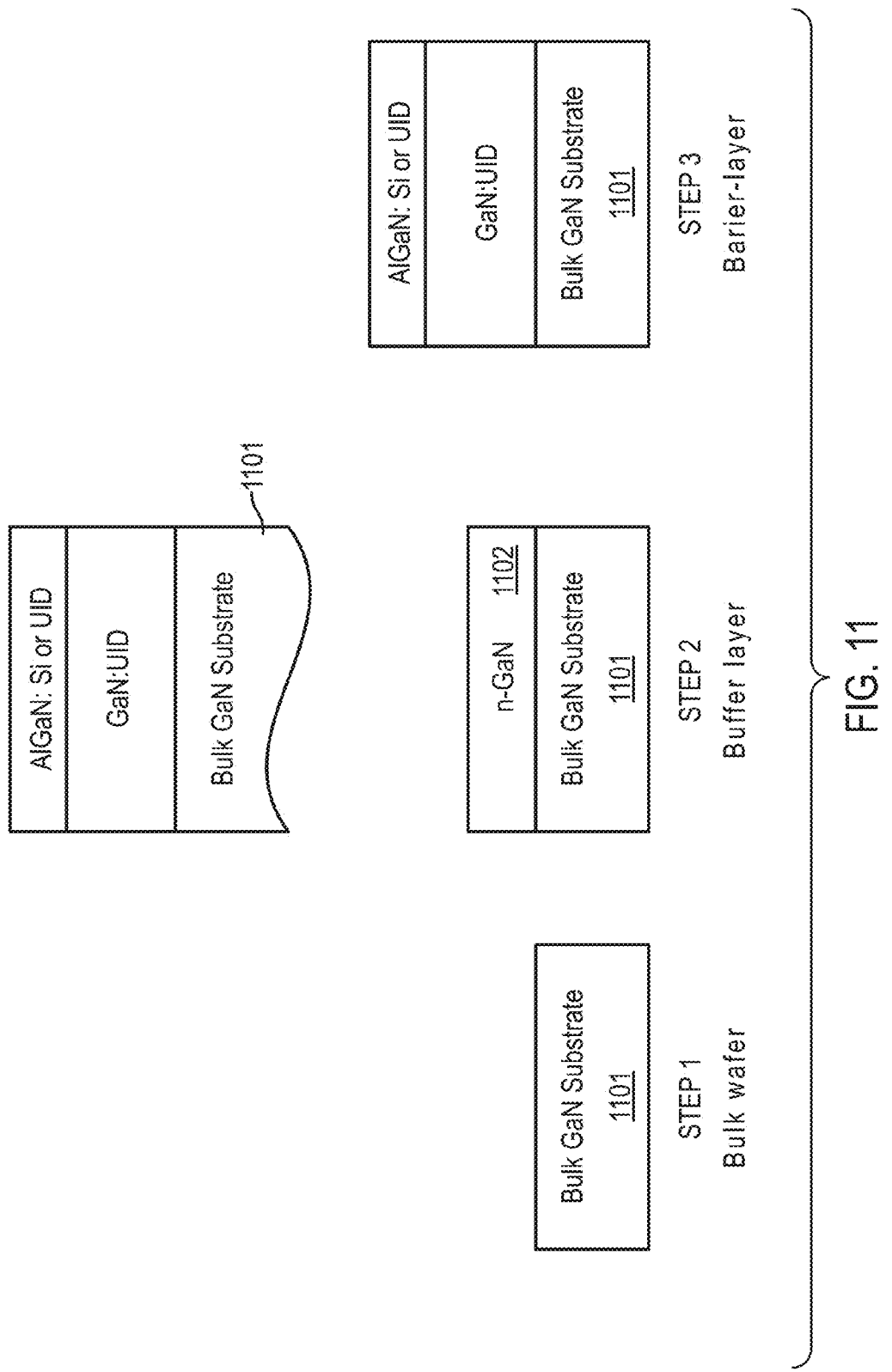
FIG. 11 shows steps for growing a high electron mobility transistor or a metal-semiconductor field effect transistor according to certain embodiments provided by the present disclosure.

FIG. 11 shows an example of a simplified growth method for forming a high electron mobility transistor or a metal-semiconductor field effect transistor according to certain embodiments provided by the present disclosure. As shown, the growth sequence includes depositing at least (1) an unintentionally doped epitaxial material (buffer); and (4) an (AlInGaN) barrier material, which is either unintentionally doped or n-type doped. In certain embodiments, bulk GaN substrate 1101 includes a (Al,Ga,In)N-based substrate with any orientation such as a miscut orientation disclosed herein, a threading dislocation density less than 1E8 $cm^{-2}$, a stacking fault density less than 5E3 $cm^{-1}$ and a doping greater than 1E1 7 $cm^{-3}$ In certain embodiments, buffer layer 1102 is (AL,Ga,IN)-based such as n-GaN. In certain embodiments, buffer layer 1102 has a thickness less than 2 µm, less than 1 µm, less than 0.5 µm, and in certain embodiments, less than 0.2 µm. In certain embodiments, buffer layer 1102 is grown at a temperature less than 1200° C. and in certain embodiments, less than 1000° C. In certain embodiments, buffer layer 1102 comprises a single layer rendered semi-insulating by Fe or C doping. In certain embodiments, buffer layer 1102 is unintentionally doped. In certain embodiments, a barrier layer has a thickness less than 0.1 µm, less than 500 nm, and in certain embodiments, less than 30 nm. In certain embodiments, the barrier layer is (Al,Ga,In)N-based such as AlGaN, which may be doped with Si or unintentionally doped. In certain embodiments, the barrier layer is a single layer. In certain embodiments, the barrier layer is grown at a temperature of less than 1200° C., less than 1100° C., and in certain embodiments, less than 1000° C. As shown at the top of FIG. 11, in certain embodiments, a device may be a HEMT or a MESFET, comprising, for example, a bulk GaN substrate 1101, an unintentionally doped GaN buffer layer, and an unintentionally doped or Si-doped AlGaN barrier layer.

Although the above disclosure is primarily directed to LED devices, it will be appreciated that the methods and materials can be applied to the fabrication and processing of other electronic and optoelectronic devices. As an example, certain embodiments provided by the present disclosure can be applied using an autocassette MOCVD reactor where the cassette holds two or more single wafers or wafer platters for multi-wafer reactors. In certain embodiments, an epitaxial structure can form an LED device capable of emitting electromagnetic radiation in a range of 390-420 nm, 420-460 nm, 460-450 nm, 500-600 nm, and others. In certain embodiments, various devices can be fabricated using methods, substrates, and materials provided by the present disclosure including, for example. p-n diodes, Schottky diodes, transistor, high electron mobility transistors (HEMT), bipolar junction transistors (BJT), heterojunction bipolar transistors (HBT), metal-semiconductor field effect transistors (MESFET), metal-oxide-semiconductor field effect transistors (MOSFET), metal-insulator-semiconductor heterojunction field effect transistors (MISHFET), and combinations of any of the foregoing. In certain embodiments, a gallium and nitrogen containing material used as a substrate can be characterized by one or various surface orientations, e.g., nonpolar, semipolar, polar.

Finally, it should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

What is claimed is:

1. A device comprising:
   a bulk (Al,Ga,In)N substrate having a width;
   a plurality of epitaxial layers overlying the bulk (Al,Ga,In)N substrate and defining a light-emitting device structure,
   wherein a top surface of the device structure is characterized by a nominal c-plane crystallographic orientation miscut by an angle from 0.35 degrees to 1 degrees toward an m-direction; and
   wherein the epitaxial layers of the light-emitting device structure are configured to have a standard deviation of photoluminescent wavelength uniformity of less than 1% across the width.

2. The device of claim 1, wherein:
   the epitaxial layers of the light-emitting device structure are configured such that the top surface is characterized by a root mean square surface roughness of less than 1 nm across the width.

3. The device of claim 2, comprising at least one n-type doped layer overlying the bulk (Al,Ga,In)N substrate.

4. The device of claim 3, comprising at least one active region overlying the at least one n-type doped layer.

5. The device of claim 4, wherein the top surface is characterized by a nominal Ga-face c-plane crystallographic orientation miscut by an angle from 0.35 degrees to 1 degrees toward a <1-100> direction, and by an angle from −1 degree to 1 degree toward a <11-20> direction.

6. The device of claim 4, comprising at least one p-type doped layer overlying the at least one active region.

7. The device of claim 4, wherein the at least one active layer comprises AlInGaN.

8. The device of claim 1, wherein the top surface is characterized by an RMS surface roughness from 0.25 nm to 0.6 nm across the width.

9. The device of claim 1, wherein the top surface is characterized by a RMS surface roughness less than 0.2 nm across the width.

10. The device of claim 1, wherein the device structure is characterized by a standard deviation of photoluminescent wavelength uniformity is less than 1% across the width.

11. The device of claim 1, wherein the device structure is characterized by a standard deviation of photoluminescent wavelength uniformity is less than 0.2% across the width.

12. The device of claim 1, wherein the miscut angle is from 0.35 degrees to 0.8 degrees toward the m-direction.

13. The device of claim 1, wherein the top surface is further characterized by a miscut angle from −1 degrees to 1 degree toward a <11-20> direction.

14. The device of claim 1, wherein the device comprises a light emitting diode.

15. The device of claim 14, wherein the light emitting diode is characterized by an output power of at least 2 milliwatts at 20 milliamps drive current.

16. The device of claim 15, wherein the device comprises a wafer.

17. A semiconductor device fabricated from the wafer of claim 16.

18. The device of claim 1, wherein the bulk (Al,Ga,In)N is bulk GaN.

19. A light emitting diode (LED) comprising:
   a bulk (Al,Ga,In)N substrate having a width;
   a plurality of epitaxial layers overlying the substrate and defining a top surface;
   wherein the top surface is characterized by a nominal c-plane crystallographic orientation miscut by an angle from 0.35 degrees to 1 degrees toward an m-direction; and
   wherein the epitaxial layers are configured to have a standard deviation of photoluminescent wavelength uniformity of less than 1% across the width.

20. The LED of claim 19, wherein the bulk (Al,Ga,In)N is bulk GaN.

* * * * *